(12) United States Patent
Choe et al.

(10) Patent No.: US 9,435,922 B2
(45) Date of Patent: Sep. 6, 2016

(54) IMAGE SENSOR AND METHOD USING NEAR INFRARED SIGNAL

(75) Inventors: Won-Hee Choe, Hwaseong-si (KR); Seong-Deok Lee, Seongnam-si (KR); Young-Jin Yoo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 603 days.

(21) Appl. No.: 13/067,755

(22) Filed: Jun. 23, 2011

(65) Prior Publication Data

US 2011/0317018 A1 Dec. 29, 2011

(30) Foreign Application Priority Data

Jun. 24, 2010 (KR) .................. 10-2010-0060174

(51) Int. Cl.
*G02B 5/20* (2006.01)
*H01L 27/14* (2006.01)
*H04N 5/33* (2006.01)
*H01L 27/146* (2006.01)

(52) U.S. Cl.
CPC ......... *G02B 5/201* (2013.01); *H01L 27/14621* (2013.01); *H01L 27/14645* (2013.01); *H01L 27/14649* (2013.01); *H04N 5/332* (2013.01)

(58) Field of Classification Search
CPC ....... G02B 5/00; H01L 27/00; H01L 27/146; H04N 5/33
See application file for complete search history.

(56) References Cited

U.S. PATENT DOCUMENTS

| 7,329,856 B2* | 2/2008 | Ma et al. ................. 250/226 |
| 7,538,311 B2* | 5/2009 | Watanabe ................. 250/226 |
| 7,538,322 B2* | 5/2009 | Luo et al. ................. 250/304 |
| 7,755,016 B2* | 7/2010 | Toda et al. ............... 250/208.1 |
| 7,767,964 B2* | 8/2010 | Nakata ..................... 250/330 |
| 8,035,069 B2* | 10/2011 | Toda et al. ............... 250/208.1 |
| 8,222,603 B2* | 7/2012 | Lee ........................ 250/336.1 |

(Continued)

FOREIGN PATENT DOCUMENTS

| JP | 2000-059798 | 2/2000 |
| JP | 2002-320139 | 10/2002 |

(Continued)

OTHER PUBLICATIONS

Korean Office Action issued on Mar. 14, 2016 in counterpart Korean Application No. 10-2010-0060174 (7 pages in Korean with English translation).

*Primary Examiner* — Reza Aghevli
(74) *Attorney, Agent, or Firm* — NSIP Law

(57) ABSTRACT

An image sensor capable of ensuring high sensitivity image and minimizing color distortion is provided. The image sensor includes a first filter unit, a second filter unit formed at a lower part of the first filter unit and a sensor unit formed at a lower part of the second filter unit. The first filter unit is configured to pass light corresponding to a visible light region, pass light corresponding to a first region of a longer wavelength than the light corresponding to the visible region and cut off light corresponding to a second region of a longer wavelength than the light corresponding to the first region. The second filter unit is configure to pass light having a predetermined wavelength in a wavelength range corresponding to the visible light region among the light passing through the first filter unit and pass light corresponding to the first region. The sensor unit is configured to detect the light passing through the second filter unit.

17 Claims, 4 Drawing Sheets

(56) References Cited

U.S. PATENT DOCUMENTS

| | | | |
|---|---|---|---|
| 8,519,319 B2* | 8/2013 | Toda et al. | 250/208.1 |
| 8,581,174 B2* | 11/2013 | Dai et al. | 250/226 |
| 2006/0043260 A1* | 3/2006 | Ma et al. | 250/208.1 |
| 2007/0045517 A1* | 3/2007 | Fukuyoshi et al. | 250/208.1 |
| 2007/0145273 A1 | 6/2007 | Chang | |
| 2007/0175273 A1* | 8/2007 | Follini et al. | 73/152.27 |
| 2007/0211155 A1* | 9/2007 | Numata | 348/272 |
| 2008/0068478 A1* | 3/2008 | Watanabe | 348/294 |
| 2008/0259192 A1 | 10/2008 | Choe et al. | |
| 2008/0273591 A1* | 11/2008 | Brooks et al. | 375/240.01 |
| 2008/0297614 A1* | 12/2008 | Lieberman et al. | 348/222.1 |
| 2008/0308712 A1* | 12/2008 | Ono | 250/208.1 |
| 2010/0051785 A1* | 3/2010 | Dai et al. | 250/208.1 |
| 2010/0084728 A1* | 4/2010 | Yamada | 257/432 |
| 2010/0141816 A1* | 6/2010 | Maruyama et al. | 348/294 |

FOREIGN PATENT DOCUMENTS

| | | | | |
|---|---|---|---|---|
| JP | 2004-032243 | * | 1/2004 | G02B 5/28 |
| JP | 2006-313974 A | | 11/2006 | |
| KR | 10-2008-0069007 | | 7/2008 | |
| KR | 10-2008-0095054 A | | 10/2008 | |

* cited by examiner

IMAGE SENSOR AND METHOD USING NEAR INFRARED SIGNAL

CROSS-REFERENCE TO RELATED APPLICATIONS

This application claims the benefit under 35 U.S.C. §119 (a) of Korean Patent Application No. 10-2010-0060174, filed on Jun. 24, 2010, the disclosure of which is incorporated by reference in its entirety for all purposes.

BACKGROUND

1. Field

One or more embodiments relate to technology and techniques for detecting light and generating an image according to the detected light.

2. Description of the Related Art

An image sensor detects incident light and generates image data corresponding to the detected light. Generally, the image sensor includes an infrared light (IR) cutoff filter provided at an initial light incidence portion, e.g., an upper part, of the image sensor, a color filter array (CFA) provided below the IR cutoff filter at a middle part of the image sensor, and a photodetector provided below the CFA at a lower part of the image sensor.

The IR cutoff filter is a type of low pass filter (LPF) which cuts off light having a wavelength of about 650 nm and above, that is, infrared light. The color filter array is a band pass filter (BPF) which selectively passes visible light of a predetermined wavelength range such as respective red light (R), green light (G), and blue light (B) among light of a wavelength range of about 400 nm to 700 nm. For example, the color filter array may be implemented using a Bayer filter, where the different filtered lights of different colors are arranged in a Bayer pattern. Respective filters in a Bayer pattern may include 50% G filters, 25% R filters, and 25% B filters, with repeated combinations of RG and GB. The Bayer patterns have been referred to as RGBG, GRGB, or RGGB, which respectively represent different relational placements of each of the respective R, G, and B filters. Accordingly, the photodetector detects light after passing through the IR cutoff filter and the color filter array and generates an image signal corresponding to the detected light, with the image signal representing the captured image data.

After each of the R, G, and B filters, if infrared light still exists in the respective filtered light incident on the respective photodetector, the captured image data would include a color distortion due to the infrared light. Accordingly, it is common to cut off infrared light incident to the photodetector by use of the IR cutoff filter. However, despite such color distortion, it may still be necessary to not use an IR cutoff filter, and thus permit IR to be incident on the photodetector, to obtain a high sensitivity image. The IR cutoff filter may be removed to permit a greater amount of light, that is, light of a broader range of wavelengths to be passed to the respective photodetector, so high sensitivity image can be obtained.

In other words, generally, in the image sensor, the use of the IR cutoff filter reduces the color distortion of the image but makes it difficult to obtain a high sensitivity image. If the IR cutoff filter is not used, a high sensitivity image is obtained but the possibility of causing color distortion of the image is increased.

SUMMARY

In one or more embodiments, there is provided an image sensor including a filter unit to filter incident light, the filter unit configured to pass wavelengths of the incident light corresponding to a visible light region including visible wavelengths, pass wavelengths of the incident light corresponding to a defined first region including non-visible wavelengths longer than the visible wavelengths, and minimize passage of wavelengths of the incident light corresponding to a second region including wavelengths longer than the passed light corresponding to the first region, and a sensor unit configured in the image sensor to detect light having passed through the filter unit.

In one or more embodiments, there is provided an image sensor including a filter unit to filter incident light, the filter unit configured to selectively pass wavelengths of the incident light within a predetermined wavelength range within a visible light region, of plural predetermined wavelength ranges within the visible light region, corresponding to visible light wavelengths, to pass wavelengths of the incident light corresponding to a defined first region including non-visible wavelengths longer than the visible wavelengths of the visible light region, and to minimize passage of wavelengths of the incident light corresponding to a second region including wavelengths longer than the passed light corresponding to the first region, and a sensor unit configured in the image sensor to detect light having passed through the filter unit.

In one or more embodiments, there is provided an image sensor including a first filter unit to filter incident light, the filter unit configured to pass wavelengths of the incident light corresponding to a visible light region including visible wavelengths, pass wavelengths of the incident light corresponding to a defined first region including non-visible wavelengths longer than the visible wavelengths, and minimize passage of wavelengths of the incident light corresponding to a second region including wavelengths longer than the passed light corresponding to the first region, a second filter unit configured to selectively pass wavelengths of light incident from the first filter unit, by passing the light incident from the first filter unit having a set predetermined range of wavelengths within the visible light region, of plural predetermined ranges of wavelengths within the visible light region, or by passing wavelengths of the light incident from the first filter unit corresponding to the first region, and a sensor unit configured in the image sensor to detect light having passed through the second filter unit.

In one or more embodiments, there is provided an image sensor including a filter unit configured to pass light having a predetermined wavelength of a wavelength range corresponding to a visible light region and infrared light, and a sensor unit configured to detect the light passing through the filter unit, wherein an upper part of the sensor unit detects the light having the predetermined wavelength of the wavelength range corresponding to the visible light region and a lower part of the sensor unit detects light having a wavelength range of about 650 nm to about 800 nm.

In one or more embodiments, there is provided an image sensor configuring method, the method including configuring a filter unit to filter incident light, including configuring the filter unit to pass wavelengths of the incident light corresponding to a visible light region including visible wavelengths, pass wavelengths of the incident light corresponding to a defined first region including non-visible wavelengths longer than the visible wavelengths, and minimize passage of wavelengths of the incident light corresponding to a second region including wavelengths longer than the passed light corresponding to the first region, configuring a sensor unit to detect light having passed through the filter unit, and configuring the filter unit and the sensor unit in an image sensor.

In one or more embodiments, there is provided an image sensing method, the method including passing wavelengths of incident light corresponding to a visible light region including visible wavelengths, passing wavelengths of the incident light corresponding to a defined first region including non-visible wavelengths longer than the visible wavelengths, and minimizing passage of wavelengths of the incident light corresponding to a second region including infrared (IR) wavelengths longer than the passed light corresponding to the first region, and detecting light having passed through the filter unit.

Additional aspects and/or advantages of one or more embodiments will be set forth in part in the description which follows and, in part, will be apparent from the description, or may be learned by practice of one or more embodiments of disclosure. One or more embodiments are inclusive of such additional aspects.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
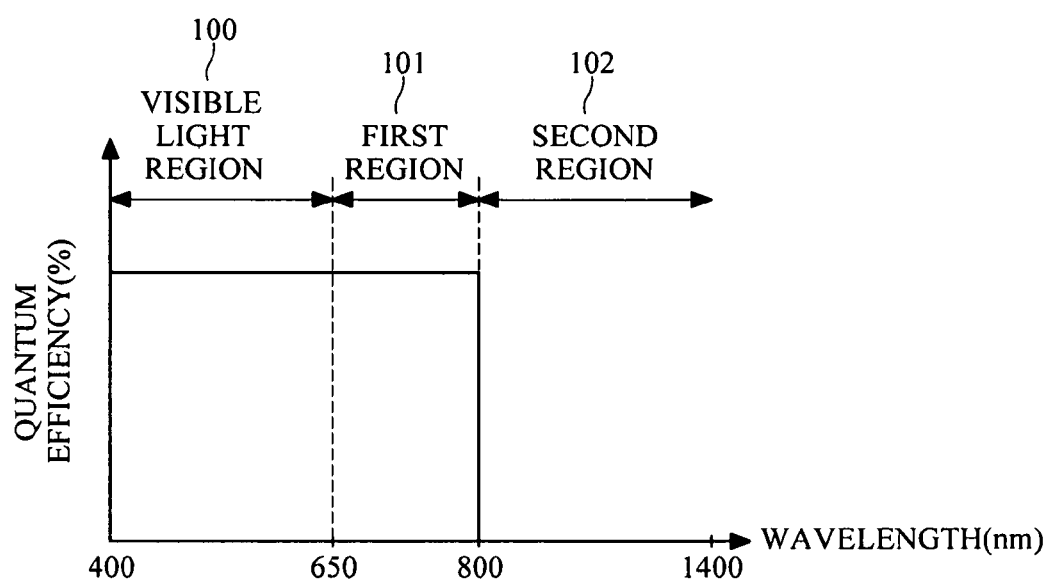
FIG. 1 illustrates select wavelength ranges of light, according to one or more embodiments.

Reference will now be made in detail to one or more embodiments, illustrated in the accompanying drawings, wherein like reference numerals refer to like elements throughout. In this regard, embodiments of the present invention may be embodied in many different forms and should not be construed as being limited to embodiments set forth herein, as various changes, modifications, and equivalents of the systems, apparatuses and/or methods described herein will be understood to be included in the invention by those of ordinary skill in the art after embodiments discussed herein are understood. Accordingly, embodiments are merely described below, by referring to the figures, to explain aspects of the present invention.

FIG. 1 illustrates select wavelength ranges of light, according to one or more embodiments.

As shown in FIG. 1, a wavelength range of light can be divided into a visible light region 100, including visible wavelengths, a first region 101, and a second region 102. The first region 101 may include wavelengths at or near the end point of the visible light region 100 through wavelengths at or near 800 nm, as only an example. The second region 102 may include wavelengths beginning at or near the endpoint of the first region 101, and/or wavelengths at or near about 800 nm, through wavelengths at or near about 1100 nm. In general, a visible light region typically denotes a wavelength range of about 330 nm to about 770 nm, but the term "visible light region" according to one or more embodiments, e.g., as shown in FIG. 1, herein will be referred as a range of wavelengths of about 400 nm to about 650 nm. Accordingly, in an embodiment, the first region 101 may correspond to a defined range of wavelengths of about 650 nm through about 800 nm, including non-visible wavelengths, and the second region 102 may correspond to a range of wavelengths of about 800 nm and above, or about 800 nm to 1100 nm, also as only an example. Herein, visibility of wavelengths is referring to an average human wavelength viewing capability. In general, a conventional IR cutoff filter cuts off light having a wavelength of about 650 nm and above, such that light that passes through the IR cutoff filter only includes wavelengths below 650 nm.

Figure 2:
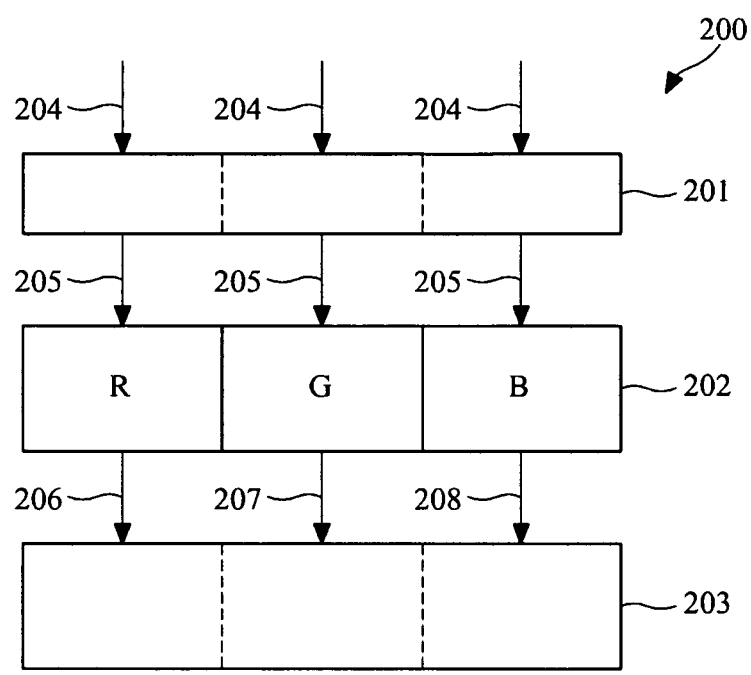
FIGS. 2 through 4 illustrate an image sensor, according to one or more embodiments.

FIG. 2 illustrates an image sensor and imaging method, according to one or more embodiments.

As shown in FIGS. 1 and 2, an image sensor 200 may include a first filter unit 201, a second filter unit 202, and a sensor unit 203, for example.

The first filter unit 201 passes light corresponding to a visible light region 100, passes light corresponding to the first region 101 and cuts off light corresponding to the second region 102. That is, the first filter unit 201 may be formed or configured to absorb or reflect light of wavelengths of about 800 nm and above, and only pass light of the remaining wavelengths. A filter that absorbs light prevents light of the absorbed wavelengths from passing through to the photodetector, for example. Similarly, by reflecting light, light of the reflected wavelengths are prevented from passing through to the photodetector. For example, the first filter unit 201 may be a dichroic filter which has a filtering characteristic determined by its own thickness and/or material, noting that alternatives are equally available.

The second filter unit 202 is formed or is configured to be optically after the first filter unit 201, e.g., at the illustrated lower part of the first filter unit 201. The second filter unit 202 passes light having a predetermined wavelength range within the wavelengths of the visible light region 100 and the first light region 101, i.e., the second filter unit 202 passes light from the first filter unit 201 that corresponds to one or more wavelength ranges within the visible light region 100 and the first region 101. For example, the second filter unit 202 may be an RGB color filter, having a Bayer pattern, with each of the R, G, and B filters passing light within respective wavelength ranges corresponding to each color and light from the first light region 101, noting that this is only an example, and alternative patterns and/or wavelength ranges are equally available.

The sensor unit 203 is formed or is configured to be optically after the second filter unit 202, e.g., at the illustrated lower part of the second filter unit 202. The sensor unit 203 detects light and generates an image signal representing captured image data. For example, the sensor unit 203 may be a photodetector, such as a charge coupled device (CCD) or a complementary metal-oxide semiconductor (CMOS), noting that alternatives are available.

Accordingly, light 204 incident to the first filter unit 201 may include light of all wavelengths. The first filter unit 201 may only pass light of a wavelength range corresponding to the visible light region 100 and the first region 101 of FIG. 1. Accordingly, light 205, having passed through the first filter unit 201, has a wavelength range corresponding to the visible light region 100 and the first region 101. The light 205 is then forwarded to the second filter unit 202. The second filter unit 202 passes light wavelengths for one or more predetermined colors, such as R, G, and B, among light wavelengths of the visible light region 100, as light 206, light 207, and light 208, respectively, and light wavelengths corresponding to the first region 101. Accordingly, light 206, light 207 and light 208 passed by the second filter unit 202 have a wavelength range corresponding to a predetermined portion of the visible light region 100 and a wavelength range corresponding to the first region 101. For example, light passing through a B pixel of the second filter unit 202 includes light having a wavelength of about 460 nm to 500 nm corresponding to blue light 208 and light having a wavelength of 650 nm to 800 nm corresponding to the first region 101. Accordingly, when the sensor unit 203 detects light and generates an image signal, a near infrared signal corresponding to the first region 101 is also detected in addition to the respective color signal corresponding to the visible light region 100, so that the color distortion is minimized and a high sensitivity image is generated. Accordingly, the inventors have discerned that near infrared light does not generate an amount of color distortion that would be sufficient to make any resulting detected image data undesirable, such that high sensitivity images may be captured even when IR is partially passed through to the photodetectors, or at least when wavelengths beyond the visible region are passed.

According to an embodiment, the second filter unit 202 may pass light of respective predetermined colors, such as R, G, and B, in a wavelength range corresponding to the visible light region 100, and selectively block light corresponding to the first region 101, e.g., with not all R, G, and/or B filters passing light corresponding to the first region 101. Here, the second filter unit 202 may thus pass light wavelength ranges within the visible light region 100 and selectively pass light corresponding to the first region 101.

Figure 3:
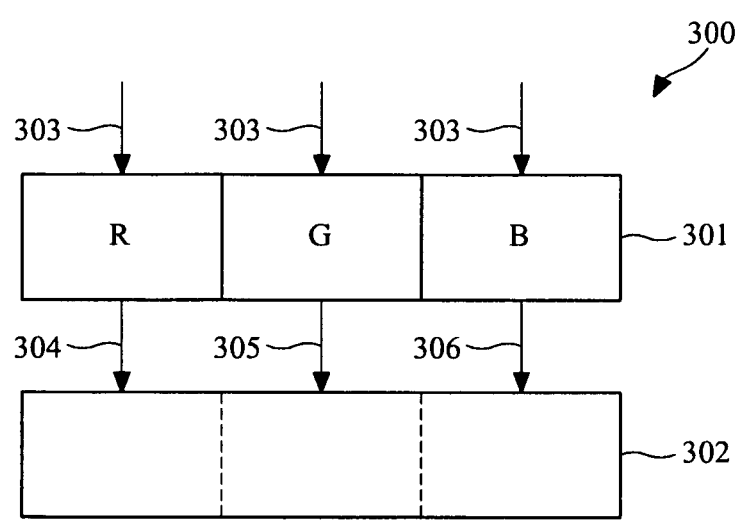

FIG. 3 illustrates an image sensor and imaging method, according to one or more embodiments.

As shown in FIGS. 1 and 3, the image sensor 300 may include a filter unit 301 and a sensor unit 302, for example.

The filter unit 301 may pass light having a predetermined wavelength, such as red light (R), green light (G) and blue light (B) among light corresponding to the visible light region 100. In addition, the filter unit 301 may pass light corresponding to the first region 101 and block light corresponding to the second region 102. That is, the filter unit 301 may absorb or reflect light of a wavelength range of about 800 nm and above, thereby blocking light corresponding to the second region 102, and pass a color signal of red light (R), green light (G) or blue light (B) and a near infrared signal of about 650 nm to 800 nm among light of the remaining range of wavelengths shorter than 800 nm. Herein, it is noted that the indicated delineations between the visible light region 100, first region 101, and second region 102 are only examples, and alternative wavelengths accomplishing the such goals are equally available. The regions may also partially overlap over limited wavelengths depending on absorbing or reflecting mechanisms employed, for example.

The sensor unit 302 is formed subsequent, e.g., at a lower part of the image sensor 300, to the filter unit 301 and detects light having passed through the filter unit 301.

Here, light incident to the filter unit 301 may include light covering the whole range of wavelengths, or at least wavelength ranges for the visible light region 100 (or select portion thereof), first region 101, and an IR portion of the second region 102. The filter unit 301 passes light having a predetermined color such as R, G and B among light corresponding to the visible light region 100 and the first region 101. Accordingly, light 304, light 305 and light 306 have wavelength ranges corresponding to a predetermined portion of the visible light region 100 and have wavelengths within and the first region 101. For example, light passing through a B pixel of the filter unit 301 includes light corresponding to blue light wavelength range about 460 nm to 500 nm and light of a wavelength of about 650 nm to 800 nm corresponding to the first region 101. Accordingly, when the sensor unit 303 detects light and generates an image signal, a near infrared signal corresponding to the first region 101 is utilized in addition to a color signal corresponding to the visible light region 100, so that the color distortion is minimized and a high sensitivity image is generated.

Figure 4:
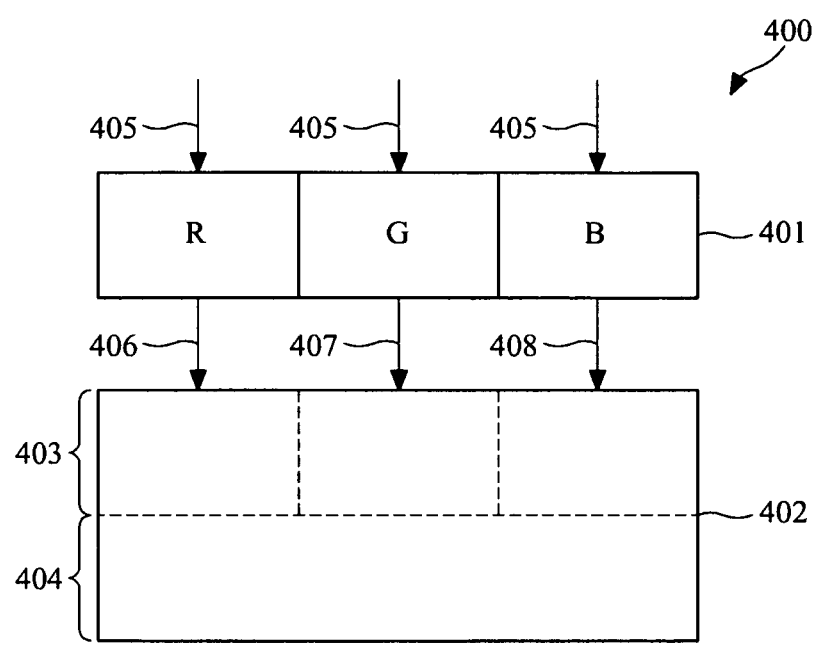

FIG. 4 illustrates an image sensor and imaging method, according to one or more embodiments.

As shown in FIGS. 1 and 4, the image sensor 400 may include a filter unit 401 and a sensor unit 402. The sensor unit 402 is divided into an upper part 403 and a lower part 404, and the filter unit 401 and sensor unit 402 may be separated, in one or more embodiments.

The filter unit 401 passes light of a predetermined wavelength in a wavelength range corresponding to the visible light region, such as red light (R), green light (G) and blue light. In addition, the filter unit 401 passes light corresponding to the first region 101 and the second region 102. That is, the filter unit 401 may pass color signals such as red light (R), green light (G) and blue light (B), and near infrared and infrared light (IR) in a wavelength range of about 650 nm and above. As an example, light passing through a B pixel of the filter unit 401 among light incident to the filter unit 401 includes light of a blue light wavelength range of about 460 nm to 500 nm and light of a wavelength of about 650 nm and above corresponding to the first region 101 and the second region 102.

The upper part 403 of the sensor unit 402 detects light corresponding to the visible light region 100 among light 406, light 407, and light 408 passing through the filter unit 401 and the lower part 404 of the sensor unit 402 detects light corresponding to the first region 101 among the light 406, the light 407 and the light 408, e.g., after having passed through the upper part 403. If the sensor unit 402 is formed using a semiconductor, the upper part 403 of the sensor unit 402 detects light of a relatively shorter wavelength and the lower part 404 of the sensor unit 402 detects light of a relatively longer wavelength. Accordingly, by adjusting the thickness of the sensor unit 402, both a color signal corresponding to the visible light region and a near infrared signal corresponding to the first region 101 are put to use.

In general, an infrared cut-off filter cuts off light having a wavelength of about 650 nm and above. Accordingly, an image sensor module positioned below the infrared cut-off filter generates an image by use of light having a wavelength of about 400 nm to 650 nm. Meanwhile, in embodiments herein, an image sensor may generate image data by use of light having wavelengths of about 400 nm to 800 nm. That is, available bandwidth is extended by 150 nm corresponding to a wavelength between 650 nm to 800 nm, and such an extended bandwidth enables a high sensitivity image to be generated. In addition, color distortion due to the extended bandwidth is not significant because 800 nm corresponds to a tradeoff point between the sensitivity and color distortion. Accordingly, by using the example of the image sensor, the color distortion is minimized and a high sensitivity image is obtained.

While aspects of the present invention has been particularly shown and described with reference to differing embodiments thereof, it should be understood that these embodiments should be considered in a descriptive sense only and not for purposes of limitation. Descriptions of features or aspects within each embodiment should typically be considered as available for other similar features or aspects in the remaining embodiments. Suitable results may equally be achieved if the described techniques are performed in a different order and/or if components in a described system, architecture, device, or circuit are combined in a different manner and/or replaced or supplemented by other components or their equivalents.

Thus, although a few embodiments have been shown and described, with additional embodiments being equally available, it would be appreciated by those skilled in the art that changes may be made in these embodiments without departing from the principles and spirit of the invention, the scope of which is defined in the claims and their equivalents.

What is claimed is:

1. An image sensor comprising:
a filter unit configured to filter incident light, the filter unit being configured to pass wavelengths of the incident light corresponding to a visible light region including visible wavelengths, pass wavelengths of the incident light corresponding to a defined first region including near infrared wavelengths, and to minimize passage of wavelengths of the incident light corresponding to a second region including infrared wavelengths, the filter unit comprising
a first portion configured to pass a first wavelength range within the wavelengths of the incident light corresponding to the visible light region, and configured to pass the wavelengths of the incident light corresponding to the first region, wherein the first wavelength range corresponds to a first color of light, and
a second portion configured to pass a second wavelength range within the wavelengths of the incident light corresponding to the visible light region, and configured to pass the wavelengths of the incident light corresponding to the first region, wherein the second wavelength range corresponds to a second color of light; and
a sensor unit configured in the image sensor to detect light having passed through the filter unit.

2. The image sensor of claim 1, wherein, in a wavelength range of light, the filter unit has a transmissive characteristic in the visible light region, a transmissive characteristic in the first region corresponding to a wavelength range between about 650 nm and about 800 nm and a blocking characteristic in the second region corresponding to a wavelength range of about 800 nm and above.

3. The image sensor of claim 2, wherein an optical characteristic of the filter unit is determined by a thickness of the filter unit and a material forming the filter unit.

4. An image sensor comprising:
a first filter unit configured to filter incident light, the filter unit being configured to pass wavelengths of the incident light corresponding to a visible light region including visible wavelengths, pass wavelengths of the incident light corresponding to a defined first region including near infrared wavelengths, and minimize passage of wavelengths of the incident light corresponding to a second region including infrared wavelengths;
a second filter unit configured to
receive, from the first filter unit, the wavelengths of the incident light corresponding to the visible light region and the wavelengths of the incident light corresponding to the first region,
pass, through a first portion of the second filter unit, a first wavelength range within the wavelengths of the incident light corresponding to the visible light region, and the wavelengths of the incident light corresponding to the first region, wherein the first wavelength range corresponds to a first color of light, and
pass, through a second portion of the second filter unit, a second wavelength range within the wavelengths of the incident light corresponding to the visible light region, and the wavelengths of the incident light corresponding to the first region, wherein the second wavelength range corresponds to a second color of light; and
a sensor unit configured in the image sensor to detect light having passed through the second filter unit.

5. The image sensor of claim 4, wherein, in a wavelength range of light, the first filter unit has a transmissive characteristic in the visible light region and the first region, corresponding to a wavelength range between about 650 nm and about 800 nm, and has a blocking characteristic in the second region corresponding to a wavelength range of about 800 nm and above.

6. The image sensor of claim 5, wherein an optical characteristic of the first filter unit is determined by a thickness of the filter unit and a material forming the first filter unit.

7. An image sensor configuring method, the method comprising:
configuring a first filter unit to filter incident light, including configuring the first filter unit to pass wavelengths of the incident light corresponding to a visible light region including visible wavelengths, pass wavelengths of the incident light corresponding to a defined first region including near infrared wavelengths, and minimize passage of wavelengths of the incident light corresponding to a second region including infrared wavelengths;
configuring a second filter unit to receive, from the first filter unit, the wavelengths of the incident light corresponding to the visible light region and the wavelengths of the incident light corresponding to the first region;
configuring a first portion of the second filter unit to pass a first wavelength range within the wavelengths of the incident light corresponding to the visible light region, and to pass the wavelengths of the incident light corresponding to the first region, wherein the first wavelength range corresponds to a first color of light;
configuring a second portion of the second filter unit to pass a second wavelength range within the wavelengths of the incident light corresponding to the visible light region, and to pass the wavelengths of the incident light corresponding to the first region, wherein the second wavelength range corresponds to a second color of light;
configuring a sensor unit to detect light having passed through the filter unit; and
configuring the filter unit and the sensor unit in an image sensor.

8. The method of claim 7, wherein, in a wavelength range of light, the first filter unit is configured to have a transmissive characteristic in the visible light region and the first region, corresponding to a wavelength range between about 650 nm and about 800 nm, and have a blocking characteristic in the second region corresponding to a wavelength range of about 800 nm and above.

9. The method of claim 8, wherein the method further comprises configuring an optical characteristic of the filter unit by configuring a thickness of the filter unit and material forming the filter unit.

10. The method of claim 8, further comprising configuring the first filter unit to pass light corresponding to all wavelengths within the visible light region.

11. The image sensor of claim 4, wherein the first filter unit passes light corresponding to all wavelengths within the visible light region.

12. The image sensor of claim 4, wherein the second filter unit selectively passes a wavelength range corresponding to a predetermined portion of the visible light region.

13. The image sensor of claim 4, wherein the second filter unit comprises an RGB color filter, included a Bayer pattern, with each of the R,G,B filters passing light within respective wavelength ranges corresponding to each color.

14. The image sensor of claim 4, wherein the sensor unit comprises a charge coupled device (CCD) or a complementary metal-oxide semiconductor (CMOS).

15. The image sensor of claim 4, wherein the sensor unit is configured to adjust the detected color signal corresponding to the visible light region and a near infrared signal corresponding to the first region by adjusting a thickness of the sensor unit.

16. The image sensor of claim 1, wherein the filter comprises an RGB color filter, included a Bayer pattern, with each of the R,G,B filters passing light within respective wavelength ranges corresponding to each color.

17. An image sensor comprising:
a first filter unit configured to filter incident light, the filter unit being configured to pass wavelengths of the incident light corresponding to a visible light region including visible wavelengths, pass wavelengths of the incident light corresponding to a defined first region including near infrared wavelengths, and minimize passage of wavelengths of the incident light corresponding to a second region including infrared wavelengths;

a second filter unit configured to
receive, from the first filter, the wavelengths of the incident light corresponding to the visible light region and the wavelengths of the incident light corresponding to the first region, pass, through a first portion of the second filter unit, a first wavelength range within the wavelengths of the incident light corresponding to the visible light region, and the wavelengths of the incident light corresponding to the first region, wherein the first wavelength range corresponds to a first color of light, pass, through a second portion of the second filter unit, a second wavelength range within the wavelengths of the incident light corresponding to the visible light region, wherein the second wavelength range corresponds to a second color of light, and block passage of the wavelengths of the incident light corresponding to the first region through the second portion of the second filter unit; and a sensor unit configured in the image sensor to detect light having passed through the second filter unit.

* * * * *